(12) United States Patent
Khachaturov

(10) Patent No.: US 12,155,179 B2
(45) Date of Patent: Nov. 26, 2024

(54) LASER APPARATUS AND METHOD OF OPERATION THEREFOR

(71) Applicant: LUMENIS LTD., Yokneam (IL)

(72) Inventor: Arkady Khachaturov, Haifa (IL)

(73) Assignee: Lumenis Ltd., Yokneam Ilit (IL)

( * ) Notice: Subject to any disclaimer, the term of this patent is extended or adjusted under 35 U.S.C. 154(b) by 888 days.

(21) Appl. No.: 17/226,263

(22) Filed: Apr. 9, 2021

(65) Prior Publication Data

US 2021/0234340 A1 Jul. 29, 2021

Related U.S. Application Data

(63) Continuation of application No. PCT/IL2019/051060, filed on Sep. 25, 2019.

(60) Provisional application No. 62/745,376, filed on Oct. 14, 2018.

(51) Int. Cl.
- *G02B 26/08* (2006.01)
- *G02B 26/04* (2006.01)
- *H01S 5/40* (2006.01)

(52) U.S. Cl.
CPC ............ *H01S 5/4075* (2013.01); *G02B 26/04* (2013.01)

(58) Field of Classification Search
CPC .... H01S 5/4075; H01S 3/2383; H01S 5/4012; H01S 3/0071; G02B 26/04; G02B 27/143
See application file for complete search history.

(56) References Cited

U.S. PATENT DOCUMENTS

| 4,922,502 A | 5/1990 | Unternahrer et al. |
| 5,387,211 A | 2/1995 | Saadatmanesh et al. |
| 2019/0097722 A1* | 3/2019 | McLaurin .......... G02B 27/0916 |

FOREIGN PATENT DOCUMENTS

| DE | 4009859 | 10/1991 |
| JP | 06-071113 | 9/1994 |
| JP | 07-009179 | 1/1995 |

OTHER PUBLICATIONS

Search Report—corresponding PCT Application No. PCT/IL2019/051060, dated Jan. 20, 2020, 4 pages.

* cited by examiner

*Primary Examiner* — Euncha P Cherry
(74) *Attorney, Agent, or Firm* — Seager, Tufte & Wickhem, LLP

(57) ABSTRACT

Laser apparatus including laser devices for emitting laser pulses, a motorized laser pulse reflection arrangement continuously rotated at a uniform angular velocity for reflecting laser pulses along a single optical path toward a target and a controller synchronized with the motorized laser pulse reflection arrangement for individually firing the laser devices for emitting a train of laser pulses reaching the target without obstruction by the motorized laser pulse reflection arrangement.

14 Claims, 5 Drawing Sheets

LASER APPARATUS AND METHOD OF OPERATION THEREFOR

RELATED APPLICATIONS

This application is a continuation application of and claims priority to PCT/IL2019/051060, filed Sep. 25, 2019, which claims the benefit and priority to U.S. Provisional Application No. 62/745,376, filed Oct. 14, 2018, the contents of all of which are incorporated by reference herein.

FIELD OF THE INVENTION

The present invention relates to laser apparatus and method of operation therefor.

BACKGROUND OF THE INVENTION

Commonly owned U.S. Pat. No. 9,939,631 to Waisman et al. discloses a multiple laser cavity laser system including a controller configured to operate the system as well as a plurality of laser cavities, each of the laser cavities having an output end wherein, when activated by the controller, an output laser beam is emitted from the output end of each of the laser cavities. The output laser beams when activated are directed, either directly or indirectly, to a rotating mirror. The rotating mirror is operatively connected to the controller and a servo motor. The servo motor, under direction of the controller, redirects the output laser beams along a common optical path and the output laser beams of the plurality of laser cavities are combined along the common optical path.

There is a need for simplified laser apparatus for emitting a train of laser pulses from multiple laser devices along a single optical path towards a target.

SUMMARY OF THE INVENTION

The present invention is directed towards laser apparatus for outputting a train of laser pulses from a linear array of laser devices along a single optical path towards a target. The linear array of laser devices includes a trailing laser device remotest from the target and at least one or more laser devices between the trailing laser device and the target. In a first embodiment, all the laser devices have an optical axis parallel to each other and intercepting the single optical path. The optical axes are preferably perpendicular to the single optical path. In a second embodiment, the trailing laser device has an optical axis co-axial with the single optical path.

The laser apparatus includes a motorized laser pulse reflection arrangement for continuously rotating a laser pulse reflector associated with each laser device of the at least one laser device between the trailing laser device and the target around a rotation axis offset from the single optical path at a uniform angular velocity for reflecting laser pulses therefrom along the optical path toward the target. In the first embodiment, the laser apparatus preferably includes a stationary laser pulse reflector for reflecting laser pulses from the trailing laser device along the optical path toward the target. In the second embodiment, the laser apparatus does not require a laser pulse reflector for the trailing laser device. The laser apparatus includes a controller synchronized with the motorized laser pulse reflection arrangement for individually firing the laser devices for emitting a train of laser pulses reaching the target without obstruction by the motorized laser pulse reflection arrangement.

The present invention is preferably implemented with the linear array of laser devices having identical laser devices in terms of laser wavelength and pulse duration. But the present invention can be implemented with laser devices emitting different laser wavelengths and/or laser pulses of different durations. Moreover, the present invention can be implemented with different types of laser devices including inter alia solid-state lasers, laser diodes, and the like.

In an aspect, a laser apparatus for emitting a train of laser pulses along a single optical path towards a target, includes:
- (a) a linear array of laser devices LD(i) where i=1, . . . , n under individual fire control for emitting laser pulses, the linear array of laser devices including:
  - i) a trailing laser device LD(1) remotest from the target, and
  - ii) at least one laser device LD(i) where i=2, . . . , n between the trailing laser device and the target, each laser device of the at least one laser device LD(i) where i=2, . . . , n emitting laser pulses along an optical axis OA(i) where i=2, . . . , n, the at least one optical axis OA(i) where i=2, . . . , n intercepting the single optical path and not being co-axial with the single optical path;
- (b) a motorized laser pulse reflection arrangement for continuously rotating a laser pulse reflector LPR(i) associated with each laser device LD(i) where i=2, . . . , n around a rotation axis offset from the single optical path at a uniform angular velocity for reflecting laser pulses along the single optical path toward the target; and
- (c) a controller synchronized with the motorized laser pulse reflection arrangement for individually firing each laser device of said linear array of laser devices for emitting a train of laser pulses reaching the target without obstruction by the motorized laser pulse reflection arrangement.

In another aspect, in the laser apparatus, the trailing laser device LD(1) emits laser pulses along an optical axis OA(1) intercepting the single optical path and non co-axial with the single optical path and further includes a laser pulse reflector for reflecting laser pulses from the trailing laser device along the single optical path toward the target.

In yet another aspect, in the laser apparatus, the trailing laser device LD(1)'s laser pulse reflector is stationary. Also, the trailing laser device LD(1)'s optical axis OA1 is co-axial with the single optical path. Further, the at least one optical axis OA(i) where i=2, . . . , n are perpendicular to the single optical path.

In an aspect, a method of operation of laser apparatus for emitting a train of laser pulses along a single optical path towards a target, includes the following steps:
- (a) providing a linear array of laser devices LD(i) where i=1, . . . , n under individual fire control for emitting laser pulses, the linear array of laser devices including:
  - i) a trailing laser device LD(1) remotest from the target, and
  - ii) at least one laser device LD(i) where i=2, . . . , n between the trailing laser device and the target, each laser device of the at least one laser device LD(i) where i=2, . . . , n emitting laser pulses along an optical axis OA(i), the at least one optical axis OA(i) where i=2, . . . , n being parallel and intercepting the single optical path and not being co-axial with the single optical path;
- (b) continuously rotating a motorized laser pulse reflection arrangement having a laser pulse reflector LPR(i) associated with each laser device LD(i) where i=2, . .

., n around a rotation axis offset from the single optical path at a uniform angular velocity for reflecting laser pulses along the single optical path toward the target; and (c) individually firing each said laser device of the linear array of laser devices in synchronization with the motorized laser pulse reflection arrangement for emitting a train of laser pulses reaching the target without obstruction by the motorized laser pulse reflection arrangement.

In a further aspect of the method, the trailing laser device LD(1) emits laser pulses along an optical axis OA(1) intercepting the single optical path and is not co-axial with the single optical path and provides a laser pulse reflector for reflecting laser pulses from the trailing laser device along the single optical path toward the target.

In yet another aspect of the method, the trailing laser device LD(1)'s laser pulse reflector is stationary. Also, the trailing laser device LD(1)'s optical axis OA1 is co-axial with the single optical path. Further, the at least one optical axis OA(i) where i=2, . . . , n are perpendicular to the single optical path.

In another aspect, the at least one laser device LD(i) is a plurality of LD(i) laser devices, further comprising a plurality of optical axes OA(i), and wherein the optical axes OA(i) of the plurality of LD(i) laser devices are parallel to one another.

In a yet another aspect, in the method, the at least one laser device LD(i) is a plurality of LD(i) laser devices, further comprising a plurality of optical axes OA(i), and wherein the optical axes OA(i) of the plurality of LD(i) laser devices are parallel to one another.

In a further aspect of the laser apparatus, the plurality of optical axes OA(i) are at angles other than perpendicular to the single optical path.

In a further aspect of the method, the plurality of optical axes OA(i) are at angles other than perpendicular to the single optical path.

BRIEF DESCRIPTION OF DRAWINGS

In order to understand the invention and to see how it can be carried out in practice, preferred embodiments will now be described, by way of non-limiting examples only, with reference to the accompanying drawings in which similar parts are likewise numbered, and in which.

DETAILED DESCRIPTION OF DRAWINGS

The present invention is for laser apparatus including a linear array of laser devices for emitting a train of laser pulses along a single optical path towards a target. For illustrative purposes, the present invention is described for identical laser devices in terms of laser wavelength and pulse duration t. In use, the linear array of laser devices are intended to be repeatedly fired in the same consecutive order starting from a trailing laser device remotest from a target to a leading laser device closest to a target.

Figure 1:
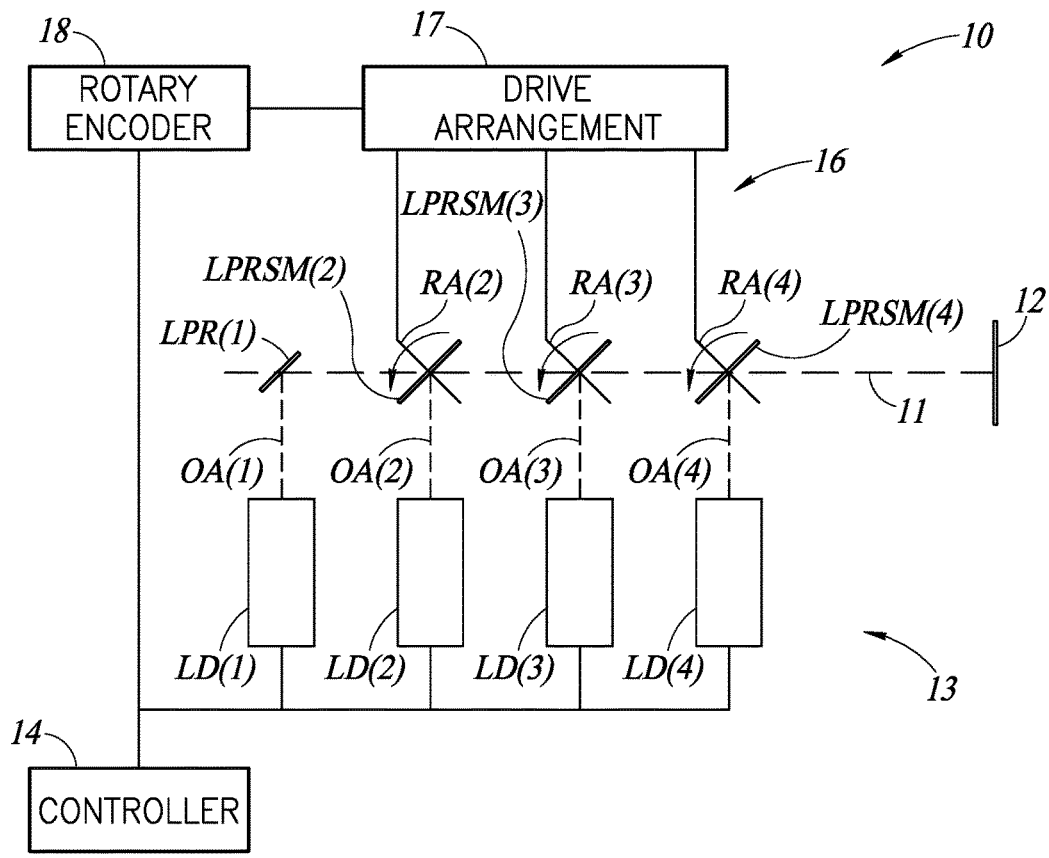
FIG. 1 is a combined schematic side elevation view and block diagram of laser apparatus for emitting a train of laser pulses along a single optical path towards a target according to a first embodiment of the present invention.
Figure 2:
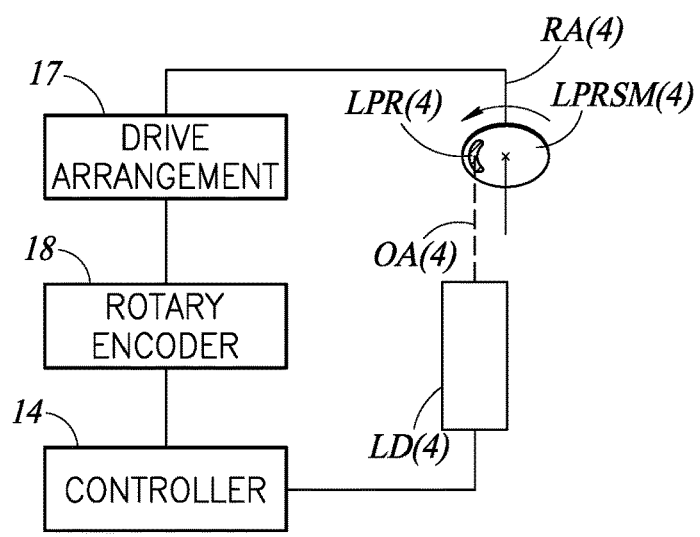
FIG. 2 is a combined schematic front elevation view and block diagram of FIG. 1's laser apparatus.

FIG. 1 and FIG. 2 show laser apparatus 10 for emitting a train of laser pulses along a single optical path 11 towards a target 12. The laser apparatus 10 includes a linear array 13 of four laser devices LD(1) to LD(4). The linear array 13 includes a trailing laser device LD(1), a laser device LD(2), a laser device LD(3) and a leading laser device LD(4) closest to the target 12. The laser devices LD(2) to LD(4) are staggered at equal separations starting from the trailing laser device LD(1) along the optical path 11 towards the target 12. The laser apparatus 10 includes a controller 14 for individually firing the laser devices LD(1) to LD(4) to emit laser pulses along corresponding optical axes OA(1) to OA(4) perpendicular to the single optical path 11. The laser pulses have a generally circular laser pulse distribution with a laser pulse diameter D centred on their respective optical axes.

Figure 3:
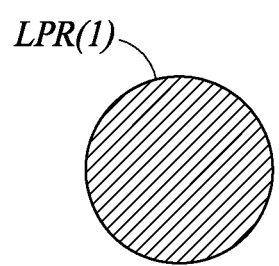
FIG. 3 is a front elevation view of a laser pulse reflector for reflecting laser pulses of a trailing laser device of FIG. 1's laser apparatus.

The laser apparatus 10 includes a stationary laser pulse reflector LPR(1) (see FIG. 3) for reflecting laser pulses from the trailing laser device LD(1) along the optical path 11 towards the target 12. The laser pulse reflector LPR(1) is located at the interception of the optical axis OA(1) and the single optical path 11 and 45° inclined to the optical axis OA(1) towards the target 12. The laser pulse reflector LPR(1) minimum size is at least equal to a laser pulse's cross section area. The laser pulse reflector LPR(1) is shaded to denote its laser light reflective property. The laser apparatus 10 includes a motorized laser pulse reflection arrangement 16 for reflecting laser pulses from the laser devices LD(2) to LD(4) along the single optical path 11 towards the target 12. The motorized laser pulse reflection arrangement 16 includes a drive arrangement 17 for simultaneously rotating disc-like laser pulse reflector support members LPRSM(2) to LPRSM (4) (see FIG. 4) correspondingly rigidly mounted on rotation axes RA(2) to RA(4) such that they resemble spinning tops. The laser pulse reflector support members LPRSM(2) to LPRSM(4) are correspondingly associated with the laser devices LD(2) to LD(4). In the exemplary set-up, the rotation axes RA(2) to RA(4) are offset to the right of the single optical path 11 in FIG. 2's front elevation view. In an alternative set-ups, the rotations axes RA(2) to RA(4) can be to the left of, above or below the single optical path 11. The laser pulse reflector support members LPRSM(2) to LPRSM(4) are 45° inclined to their respective optical axes OA(2) to OA(4) towards the target 12. The drive arrangement 17 rotates the laser pulse reflector support members LPRSM(2) to LPRSM (4) at a uniform angular velocity ω in a counter clockwise direction. The motorized laser pulse reflection arrangement 16 includes a rotary encoder 18 for providing the angular position of the laser pulse reflector support members LPRSM(2) to LPRSM (4) to the controller 14 for synchronization purposes.

Figure 4:
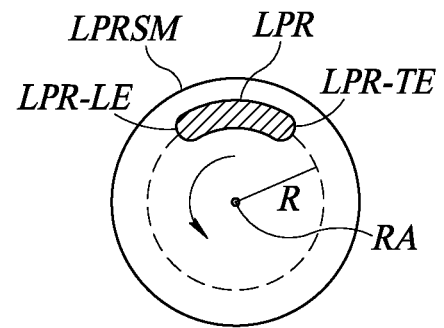
FIG. 4 is a front elevation view of a disc-like laser pulse reflector support member of FIG. 1's laser apparatus.

FIG. 4 shows a disc-like laser pulse reflector support member LPRSM with a laser pulse reflector LPR at a radius R from its rotation axis RA. The laser pulse reflector LPR is shaded to denote its laser light reflective property. The disc-like laser pulse reflector support member LPRSM is formed from material transparent to intended laser wavelengths of the laser apparatus 10. Alternatively, the laser pulse reflector support member LPRSM can be formed from material opaque to intended laser wavelengths of the laser apparatus 10 in which case it is necessarily formed with throughgoing apertures in such a manner that motorized laser pulse reflection arrangement 16 does not obstruct laser pulses reaching the target 12 as explained hereinbelow with reference to FIG. 9A to FIG. 9H. The laser pulse reflector LPR preferably has an arcuate shape having a leading edge LPR-LE and a trailing edge LPR-TE with respect to the intended counter clockwise direction of rotation.

Figure 5:
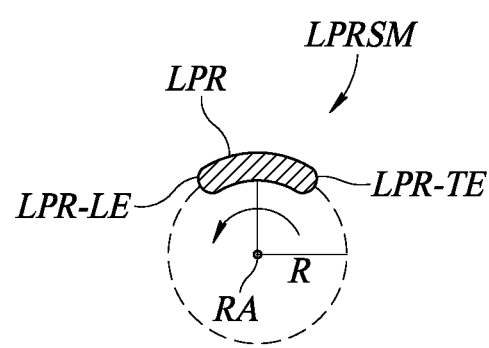
FIG. 5 is a front elevation view of a spoke-like laser pulse reflector support member of FIG. 1's laser apparatus.

FIG. 5 shows a spoke-like LPRSM with a laser pulse reflector LPR at a radius R from its rotation axis RA. The spoke-like LPRSM has the same size laser pulse reflector LPR as the disc-like LPRSM. The laser pulse reflector LPR is shaded to denote its laser light reflective property.

Figure 6:
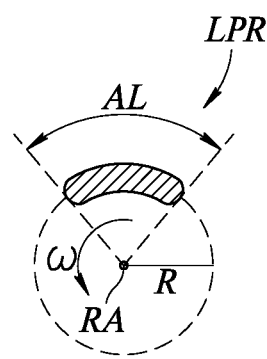
FIG. 6 is a front elevation view of a laser pulse reflector of FIG. 1's laser apparatus.

FIG. 6 shows a laser pulse reflector LPR having an arc length AL rotating at an angular velocity $\omega$ at a radius R from its rotation axis RA. The laser apparatus 10 can be suitably designed for a wide range of an intended number of laser devices and pulse durations t by way of different angular velocities w and/or different radii R. The necessary conditions for designing the laser apparatus 10 are as follows:

The number of laser devices n is determined by the ratio n=Fm/F0 where Fm is the desired repetition rate of the laser apparatus 10 and F0 is the maximal repetition rate of the laser device LD with the slowest maximal repetition rate. Accordingly, the laser apparatus 10 can include laser devices which are not being operated at their maximum repetition rates if their maximum repetition rates are faster than the laser device with the slowest maximum repetition rate. To achieve a required repetition rate F, the angular velocity $\omega$ of a laser pulse reflector LPR is determined by $\omega = 2\pi F0 / Fm\ F$.

Since the n laser pulse reflectors are required to fit on a circle of radius R, the necessary condition takes the following form:

$2\pi R / n \geq AL \geq \omega \tau R + D$.

Figure 7:
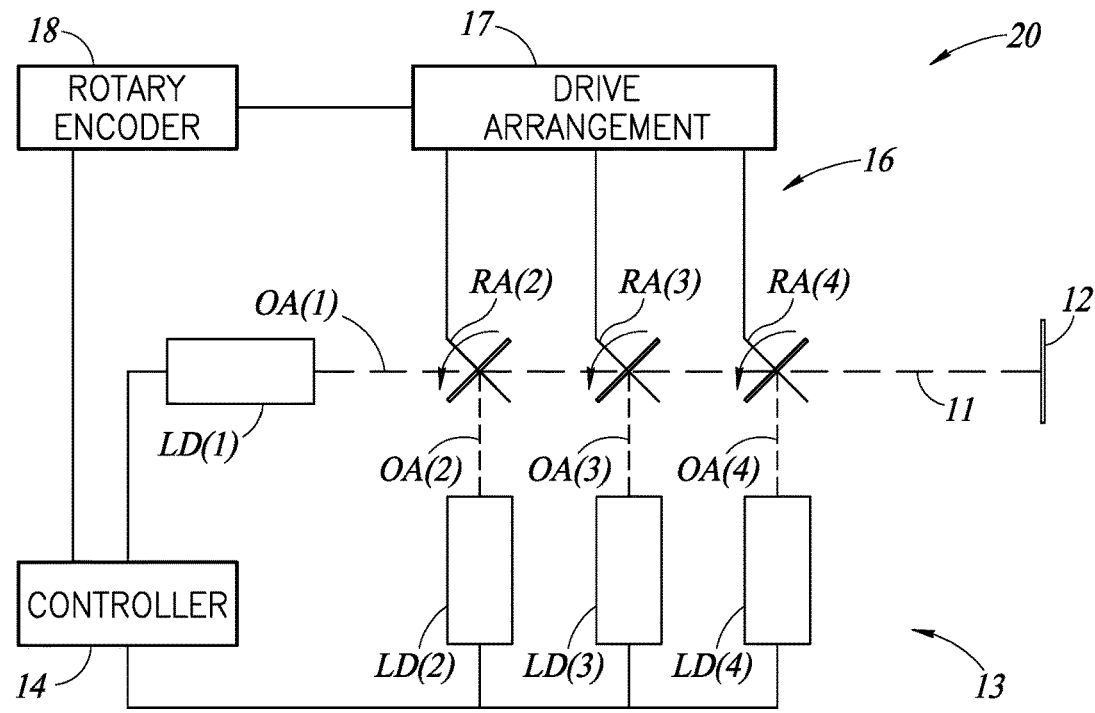
FIG. 7 is a combined schematic side elevation view and block diagram of laser apparatus for emitting a train of laser pulses along a single optical path towards a target according to a second embodiment of the present invention.

FIG. 7 shows laser apparatus 20 for emitting a train of laser pulses along a single optical path 11 towards a target 12. The laser apparatus 20 is similar in construction to the laser apparatus 10 and therefore similar parts are likewise numbered. The laser apparatus 20 differs from the laser apparatus 10 insofar as the laser apparatus 20 includes a trailing laser device LD(1) co-axial with the single optical path 11 and therefore no laser pulse reflector LPR(1) is required.

Figure 8:
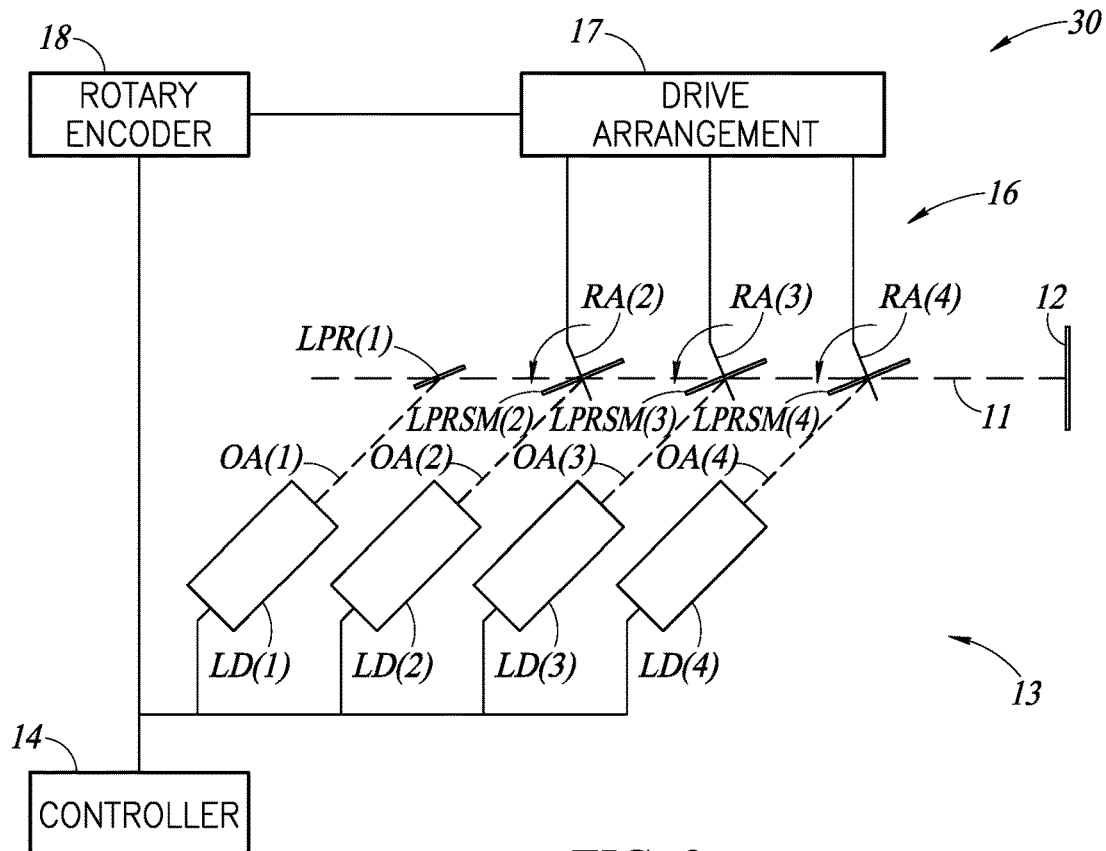
FIG. 8 is a combined schematic side elevation view and block diagram of laser apparatus for emitting a train of laser pulses along a single optical path towards a target according to a third embodiment of the present invention.

FIG. 8 shows laser apparatus 30 for emitting a train of laser pulses along a single optical path 11 towards a target 12. The laser apparatus 30 is similar in construction to the laser apparatus 10 and therefore similar parts are likewise numbered. The laser apparatus 30 differs from the laser apparatus 10 insofar as the laser apparatus 30 includes four laser devices LD(1) to LD(4) having corresponding parallel optical axes OA(1) to OA(4) intercepting the single optical path 11 and not co-axial therewith. The laser apparatus 30 includes a laser pulse reflector LPR(1) and a motorized laser pulse reflection arrangement 16 with laser pulse reflector support members LPRSM(2) to LPRSM(4) with laser pulse reflectors LPR(2) to LPR(4) correspondingly inclined for reflecting laser pulses from the laser devices LD(1) to LD(4) along the single optical path 11.

FIG. 9A to FIG. 9H show the use of the laser apparatus 10 for emitting a single round of four laser pulses along the single optical path 11 towards the target 12 starting from firing the trailing laser device LD(1). For illustrative purposes, the relative locations of the laser pulse reflectors LPR(1) to LPR(4) are described with respect to an analog clock with the single optical path being at 9 o'clock. The laser apparatus 10 is operated such that the drive arrangement 17 simultaneously rotates the laser pulse reflector support members LPRSM(2) to LPRSM (4) at a continuous uniform angular velocity @ in a counter clockwise direction. In such steady state, the operation of the laser apparatus 10 is now described with reference to FIG. 9A to FIG. 9H as follows:

Time $T(0)$

Figure 9A:
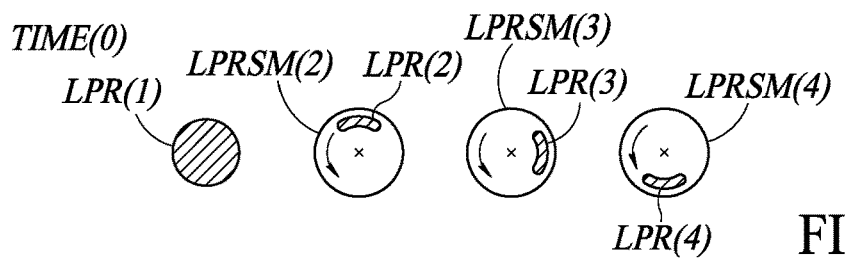
FIG. 9A to FIG. 9H show the use of FIG. 1's laser apparatus for emitting four laser pulses along the single optical path towards the target.

FIG. 9A shows when LPR(2) is at 12 o'clock, LPR(3) is at 3 o'clock and LPR(4) is at 6 o'clock, the controller 14 fires the trailing laser device LD(1).

Figure 9B:
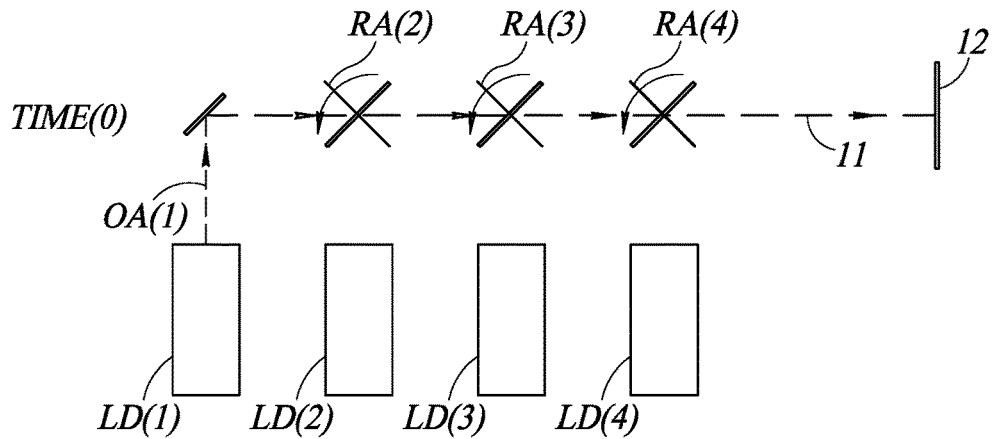

FIG. 9B shows the laser pulse reflector LPR(1) reflects the laser device LD(1)'s laser pulse from optical axis OA(1) along the single optical path 11 towards the target 12. The laser device LD(1)'s laser pulse passes through the laser pulse reflector support members LPRSM(2) to LPRSM (4) to reach the target 12 without obstruction from their laser pulse reflectors LPR(2) to LPR(4).

Time $T(1) > $ Time $T(0)$

Figure 9C:
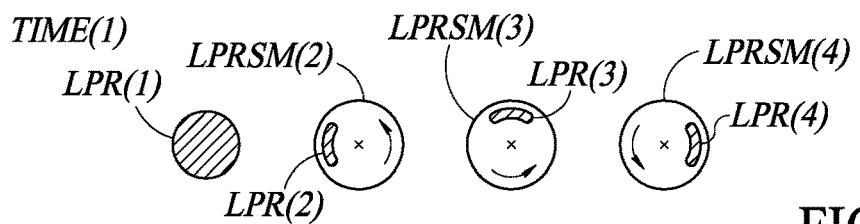

FIG. 9C shows when LPR(2) is approaching 9 o'clock, LPR(3) is approaching 12 o'clock and LPR(4) is approaching 3 o'clock, the controller 14 fires the laser device LD(2).

Figure 9D:
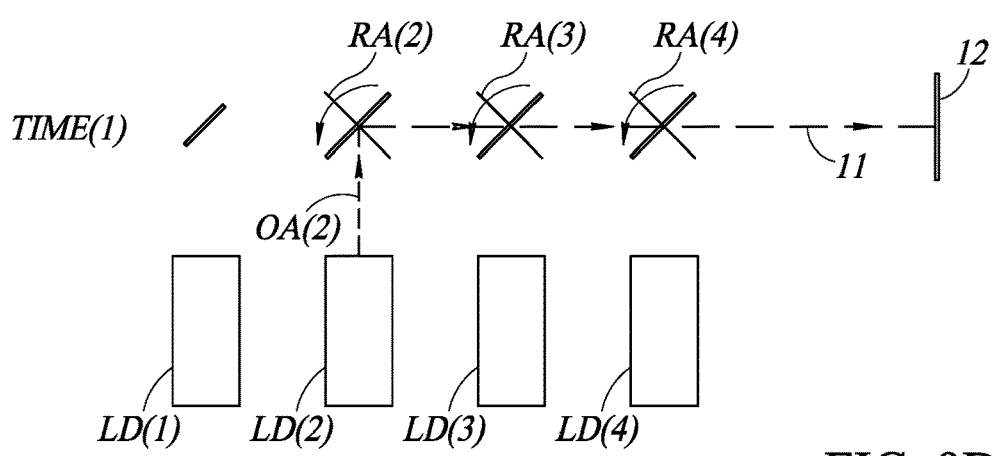

FIG. 9D shows the laser pulse reflector LPR(2) reflects the laser device LD(2)'s laser pulse from optical axis OA(2) along the single optical path 11 towards the target 12. The laser device LD(2)'s laser pulse passes through the laser pulse reflector support members LPRSM(3) and LPRSM (4) to reach the target 12 without obstruction from their laser pulse reflectors LPR(3) and LPR(4).

Time $T(2) > $ Time $T(1)$

Figure 9E:
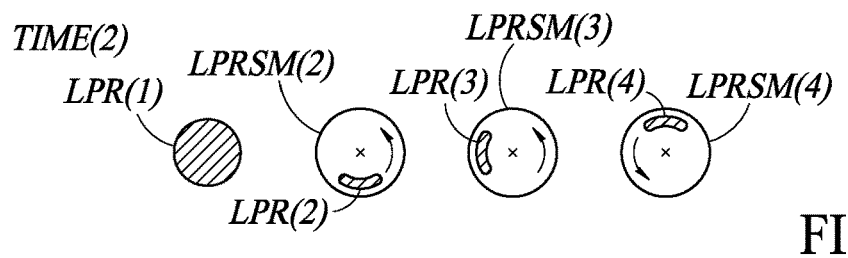

FIG. 9E shows when LPR(3) is approaching 9 o'clock, LPR(4) is approaching 12 o'clock and LPR(2) is approaching 6 o'clock, the controller 14 fires the laser device LD(3).

Figure 9F:
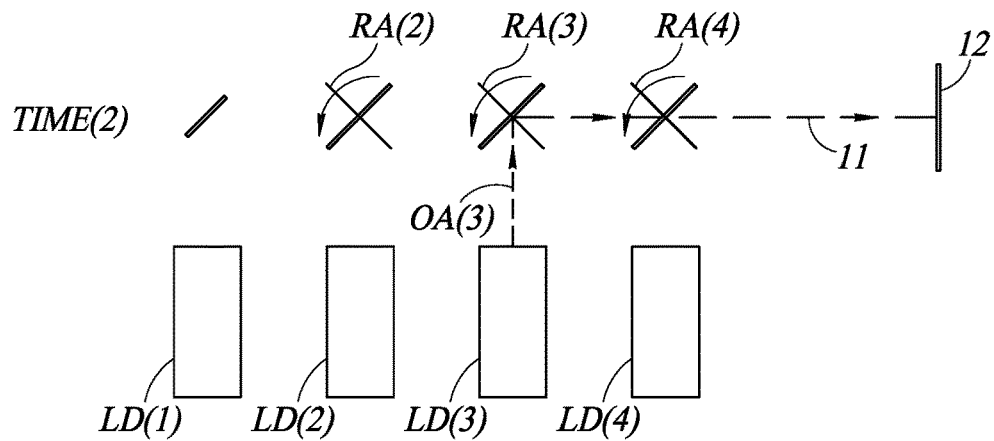

FIG. 9F shows the laser pulse reflector LPR(3) reflects the laser device LD(3)'s laser pulse from optical axis OA(3) along the single optical path 11 towards the target 12. The laser device LD(3)'s laser pulse passes through the laser pulse reflector support member LPRSM (4) to reach the target 12 without obstruction from its laser pulse reflector LPR(4).

Time $T(3) > $ Time $T(2)$

Figure 9G:
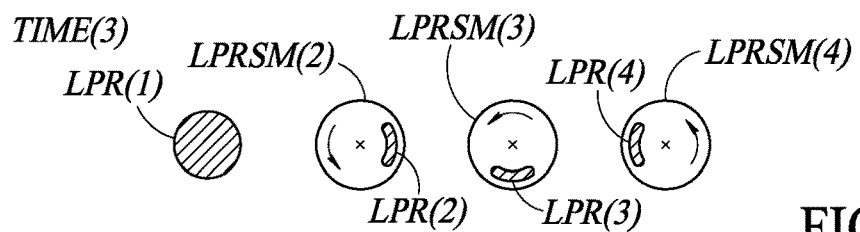

FIG. 9G shows when LPR(4) is approaching 9 o'clock, LPR(2) is approaching 3 o'clock and LPR(3) is approaching 6 o'clock, the controller 14 fires the leading laser device LD(4).

Figure 9H:
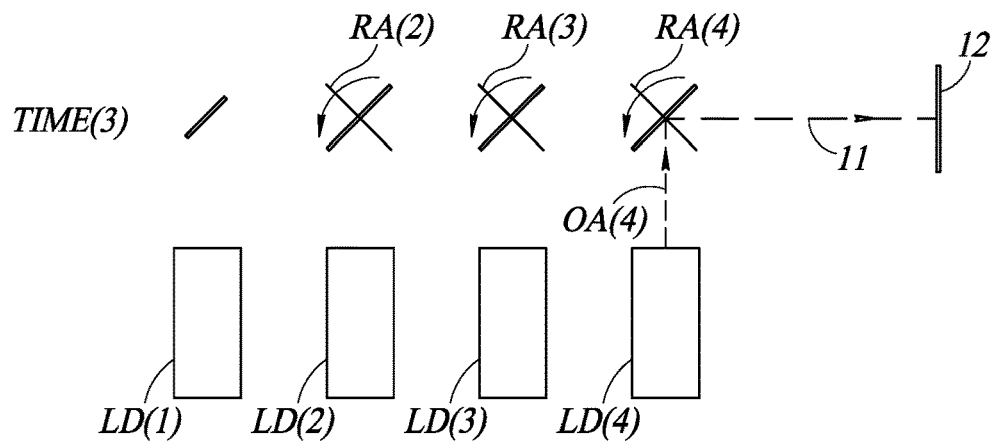

FIG. 9H shows the laser pulse reflector LPR(4) reflects the laser device LD(4)'s laser pulse from optical axis OA(4) along the single optical path 11 to directly reach the target 12.

While the invention has been described with respect to a limited number of embodiments, it will be appreciated that many variations, modifications, and other applications of the invention can be made within the scope of the appended claims.

The invention claimed is:

1. A laser apparatus for emitting a train of laser pulses along a single optical path towards a target, the laser apparatus comprising:
   an array of laser devices LD(i) where i=1, ..., n under individual fire control for emitting laser pulses, said array of laser devices including:
   a trailing laser device LD(1) remotest from the target, and
   at least one laser device LD(i) where i=2, ..., n between said trailing laser device and the target,
   wherein the laser device of said at least one laser device LD(i) where i=2, ..., n is configured to emit laser pulses along an optical axis OA(i) where i=2, ..., n,
   wherein at least one of the optical axis OA(i) where i=2, ..., n intercepts the single optical path and is not co-axial with the single optical path;
   a motorized laser pulse reflection arrangement for continuously rotating a laser pulse reflector LPR(i) associated with each said laser device LD(i) where i=2, ..., n around a rotation axis offset by a radius R from the single optical path at a uniform angular velocity ω for reflecting laser pulses along the single optical path toward the target; and
   a controller synchronized with said motorized laser pulse reflection arrangement for individually firing each said laser device of said array of laser devices for emitting a train of laser pulses reaching the target without obstruction by said motorized laser pulse reflection arrangement,
   wherein each laser pulse reflector LPR(i) associated with each said laser device LD(i) where i=2, ... n, has an arcuate shape having a leading edge and a trailing edge with respect to an intended direction of rotation, the leading edge and trailing edge defining an arc length AL which satisfies the following: AL is greater than or equal to ωτR+D, where τ is a pulse width of the laser pulses, and D is a laser pulse diameter.

2. Laser apparatus according to claim 1 wherein said trailing laser device LD(1) emits laser pulses along an optical axis OA(1) intercepting the single optical path and being non co-axial with the single optical path and further comprises a laser pulse reflector for reflecting laser pulses from the trailing laser device along the single optical path toward the target.

3. Laser apparatus according to claim 2 wherein said trailing laser device LD(1)'s laser pulse reflector is stationary.

4. Laser apparatus according to claim 1 wherein said trailing laser device LD(1)'s optical axis OA1 is co-axial with the single optical path or wherein the array of laser devices LD(i) is arranged to be linear.

5. Laser apparatus according to claim 1 wherein said at least one optical axis OA(i) where i=2, ..., n is perpendicular to the single optical path.

6. A method of operation of a laser apparatus for emitting a train of laser pulses along a single optical path towards a target, the method comprising: of operation including the following steps:
   providing an array of laser devices LD(i) where i=1, ..., n under individual fire control for emitting laser pulses, the linear array of laser devices including:
   a trailing laser device LD(1) remotest from the target, and
   at least one laser device LD(i) where i=2, ..., n between the trailing laser device and the target,
   wherein the laser device of the at least one laser device LD(i) where i=2, ..., n is configured to emit laser pulses along an optical axis OA(i),
   wherein the at least one optical axis OA(i) where i=2, ..., n intercepts the single optical path and is not co-axial with the single optical path;
   continuously rotating a motorized laser pulse reflection arrangement having a laser pulse reflector LPR(i) associated with each said laser device LD(i) where i=2, ..., n around a rotation axis offset by a radius R from the single optical path at a uniform angular velocity ω for reflecting laser pulses along the single optical path toward the target; and
   individually firing each said laser device of the linear array of laser devices in synchronization with the motorized laser pulse reflection arrangement for emitting a train of laser pulses reaching the target without obstruction by the motorized laser pulse reflection arrangement,
   wherein each laser pulse reflector LPR(i) associated with each said laser device LD(i) where i=2, ..., n, has an arcuate shape having a leading edge and a trailing edge with respect to an intended direction of rotation, the leading edge and trailing edge defining an arc length AL which satisfies the following: AL is greater than or equal to ωTR+D, where τ is a pulse width of the laser pulses, and D is a laser pulse diameter.

7. The method according to claim 6 wherein the trailing laser device LD(1) emits laser pulses along an optical axis OA(1) intercepting the single optical path and not being co-axial with the single optical path and providing a laser pulse reflector for reflecting laser pulses from the trailing laser device along the single optical path toward the target.

8. The method according to claim 7 wherein the trailing laser device LD(1)'s laser pulse reflector is stationary.

9. The method according to claim 6 wherein the trailing laser device LD(1)'s optical axis OA1 is co-axial with the single optical path or wherein the array of laser devices LD(i) is arranged to be linear.

10. The method according to claim 6 wherein the at least one optical axis OA(i) where i=2, ..., n is perpendicular to the single optical path.

11. The laser apparatus of claim 1, wherein the at least one laser device LD(i) is a plurality of LD(i) laser devices, further comprising a plurality of optical axes OA(i), and wherein the optical axes OA(i) of the plurality of LD(i) laser devices are parallel to one another.

12. The method of claim 6, wherein the at least one laser device LD(i) is a plurality of LD(i) laser devices, further comprising a plurality of optical axes OA(i), and wherein the optical axes OA(i) of the plurality of LD(i) laser devices are parallel to one another.

13. The laser apparatus of claim 11, wherein the plurality of optical axes OA(i) are at angles other than perpendicular to the single optical path.

14. The method of claim 12, wherein the plurality of optical axes OA(i) are at angles other than perpendicular to the single optical path.

* * * * *